United States Patent [19]
Massit et al.

[11] Patent Number: 6,151,173
[45] Date of Patent: Nov. 21, 2000

[54] ASSEMBLY OF OPTICAL COMPONENTS OPTICALLY ALIGNED AND METHOD FOR MAKING THIS ASSEMBLY

[75] Inventors: Claude Massit, S-Ismier; Patrick Mottier, Grenoble; François Marion, Saint Egreve, all of France

[73] Assignee: Commissariat a l'Energie Atomique, Paris, France

[21] Appl. No.: 09/319,269

[22] PCT Filed: Dec. 11, 1997

[86] PCT No.: PCT/FR97/02275

§ 371 Date: Aug. 12, 1999

§ 102(e) Date: Aug. 12, 1999

[87] PCT Pub. No.: WO98/26318

PCT Pub. Date: Jun. 18, 1998

[30]     Foreign Application Priority Data

Dec. 13, 1996 [FR] France ................................. 96/15348

[51] Int. Cl.[7] ........................................................ G02B 7/02
[52] U.S. Cl. .............................. 359/811; 438/27; 438/29; 358/14
[58] Field of Search ........................... 359/811; 438/27, 438/29; 358/14

[56]     References Cited

U.S. PATENT DOCUMENTS 5,279,711   1/1994   Frankley et al. .......................... 174/263
5,534,442   7/1996   Parker et al. ................................ 437/2
5,785,234   7/1998   Weiss et al. ............................. 228/223

FOREIGN PATENT DOCUMENTS 06088917   3/1994   Japan ............................................ 6/30

OTHER PUBLICATIONS

K.P. Jackson, et al., Journal of Lightwave Technology, vol. 12, No. 7, PPS. 1185–1191, "A High–Density, Four–Channel, OEIC Transceiver Module Utilizing Planar–Processed Optical Waveguides and Flip–Chip, Solder–Bump Technology", Jul. 1994.

M.J. Wale, et al., Report of ECOC 89, ThA19–7, pp. 368–371, "A New Self–Aligned Technique for the Assembly of Integrated Optical Devices with Optical Fibre and Electrical Interfaces".

M. Yanagisawa, et al., IEEE Photonics Technology Letters, vol. 4, No. 1, pp. 21–23, "Film–Level Hybrid Integration of AlGaAs Laser Diode with Glass Waveguide on Si Substrate", Jan. 1992.

Primary Examiner—Georgia Epps
Assistant Examiner—Timothy Thompson
Attorney, Agent, or Firm—Oblon, Spivak, McClelland, Maier & Neustadt, P.C.

[57]     ABSTRACT

An optically aligned optical component assembly. Each optical component has a plurality of first fastening studs. The surface of a support is provided with second fastening studs, where the second studs are formed with parts made of a material that can be soldered to the studs. The optical components are assembled onto the support using corresponding parts. The volume of each part is determined so that the components are optically aligned along a direction that is perpendicular to the surface of the support. This is especially used in the field of microelectronics.

10 Claims, 3 Drawing Sheets

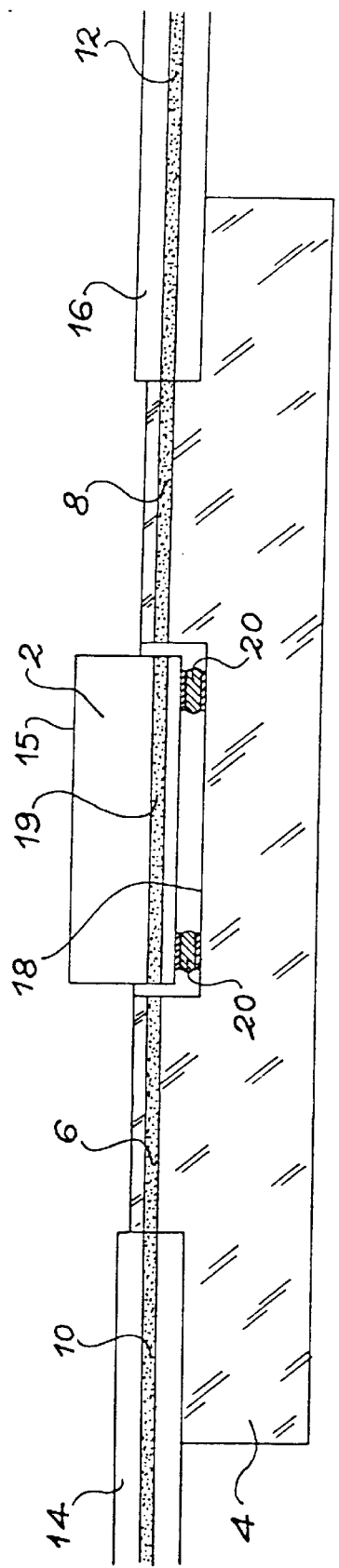
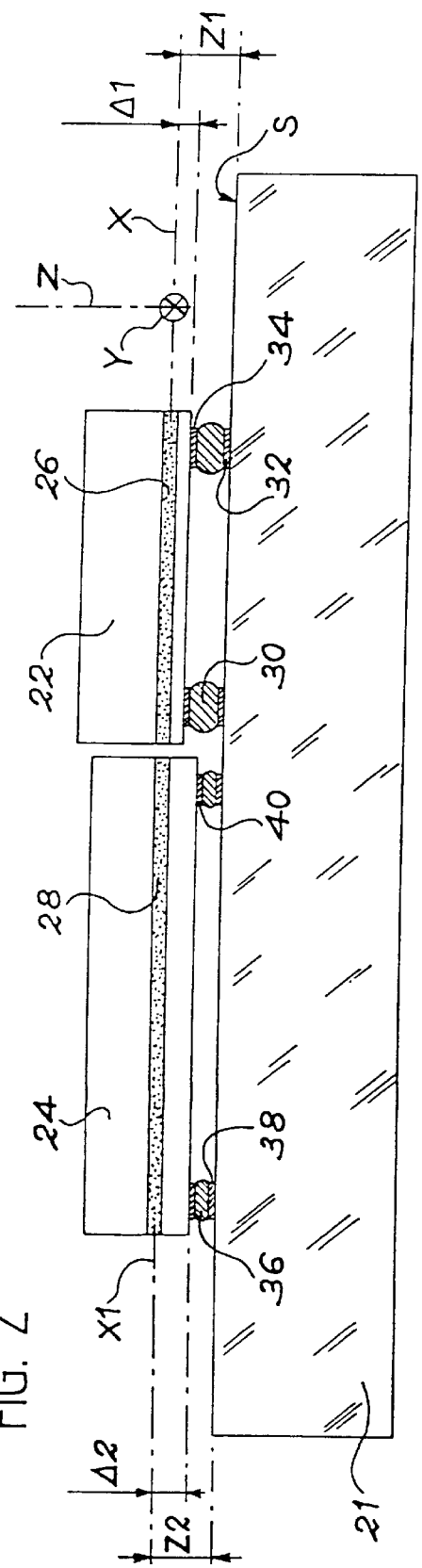
FIG. 1
FIG. 2

ASSEMBLY OF OPTICAL COMPONENTS OPTICALLY ALIGNED AND METHOD FOR MAKING THIS ASSEMBLY

BACKGROUND OF THE INVENTION

1. Field of the Invention

The present invention relates to an optically aligned optical component assembly and manufacturing process for said assembly.

The invention has applications in the field of microelectronics and is particularly used to produce optoelectronic modules that are used, for example, in optical gyrometers and multiplexers.

2. Description of the Background

In the field of microelectronics, the following aspects are required in order to increase the operating frequency of the electronic systems:

- the creation of new techniques for transmitting data, particularly the parallel use of electrical buses for transmitting several signals simultaneously, and/or:
- the use of light with optical waveguides (integrated waveguides or fiber optics) in order to increase the information output rate.

These optical waveguides provide a high resistance level to electromagnetic disturbances.

In the field of microsystems, the recent development of microtechnologies has led to applications of sensors or optical components in the field of integrated optics.

Apparatuses such as gyrometers, vibration sensors, chemical sensors, optical read heads and microswitches have recently been developed.

As for optoelectronic apparatuses intended for electronic systems, they need to be associated with several kinds of components such as optical components (waveguides, diffraction networks etc.), optoelectronic components (laser diodes, photodetectors etc.) and electronic components (integrated circuits made of silicon or AsGa etc.).

Optical transmission requires emission modules, receiving modules and luminous signal processing modules.

In order to achieve optical transmission, techniques have been developed using glass or silicon to ensure the following:

- the coupling of fiber optics
- optical and electrical connections of optoelectronic components
- electrical connection of electronic interface components.

Optically aligned optical component assemblies are already known from the following documents to which reference may be made:

(1) K. P. Jackson et al., "A high-density, four channel, OEIC transceiver module utilizing planar-processed optical waveguides and flip-chip, solder bump technology", Journal of lightwave technology, vol. 12, No. 7, July 1994, p. 1185 to 1191.

(2) M. J. Wole et al., "A new self-aligned technique for the assembly of integrated optical devices with optical fibre and electrical interfaces", report of ECOC 89, ThA19-7, p.368 to 371.

(3) T. Hayashi, "An innovative bonding technique for optical chips using solder bump that eliminate chip positioning adjustments", IEEE Transactions on components, hybrids and manufacturing technology, vol. 15, No. 2, April 1992, p. 225 to 230.

(4) M. Yanagisawa et al., "Film-level hybrid integration of ALGaAs laser diode with glass waveguide on Si substrate", IEEE Photonics technology letters, vol. 4, No. 1, January 1992, P. 21 to 23.

These known assemblies generally constitute a substrate on which:

- fiber optics are connected opposite optical waveguides in the substrate,
- optoelectronic components are fitted into this substrate and coupled to the optical waveguides,
- electronic components that address or collect information sent by optical components.

The optical and optoelectronic components must be perfectly aligned in relation to one another to minimize optical loss.

Measurements to an accuracy of within 0.5 $\mu$m can be achieved.

Different processes are used in order to achieve perfect alignment.

An active alignment process is known, the aim of which is to check the alignment performance in real time using an electrical measurement on a photodiode of an optoelectronic component placed in front of a waveguide.

In order for this to be achieved, the optoelectronic component is powered and a measurement of the luminous intensity at the output of said optoelectronic component indicates the relative alignment between the various components.

The alignment is optimized due to the restricted displacements of the part to be aligned using mechanical or piezoelectric micro-control switches.

The alignment may then be held in place using bonding. This active alignment process has a number of drawbacks:

- the length of the alignment process,
- the need to fix the position of the component mechanically, for example using bonding, after it has been aligned, and
- the need to prevent said fixed position from causing mechanical difficulties that could modify the alignment.

A passive alignment process is also known, the main aim of which is to reduce costs.

At present this alignment can be effected using the following:

- new kinds of extremely accurate equipment that enables components to be positioned on a support to an accuracy of within 0.8 $\mu$m,
- positioning blocks included in the support and the component to be assembled (see documents 1 to 4).

These systems are preferably assembled as follows:

- machining a cavity in the optical support (see document 4)
- positioning of the optical component using microassembly equipment or blocks and
- thermo-compression soldering or seam welding of the connection studs (or contact strips) of the optoelectronic component on the optical component.

This passive alignment process has the following drawbacks:

- in the event of blocks or stops being used, it is difficult to include positioning blocks in both the optical component and the optoelectronic component, and
- in the event of microassembly equipment being used, the positioning time is very long due to the high level of accuracy that is required in order to create a cavity in the substrate and to control the height of the interconnection solder bumps.

A known assembly is shown schematically in FIG. 1 of the attached drawings.

The drawing shows an optoelectronic component 2 and an optical component 4 assembly.

This optical component 4 is a substrate provided with integrated optical waveguides 6 and 8, the ends of which are connected to cores 10 and 12 of optical fibers 14 and 16 respectively.

The optoelectronic component 2 is positioned in a cavity 18 that is contained within optical component 4 such that the ends of optical stripe 19 of said component 2 are respectively opposite waveguides 6 and 8.

The optical alignment of components 2 and 4 can be achieved parallel to the plane of the substrate using a high precision positioning machine and can be achieved perpendicular to said plane using bumps 20 (soldering parts), the height of which has been calibrated.

This alignment can also be achieved during assembly by optically or electrically measuring the coupling between the optoelectronic component and the optical component.

The electric connections (not shown) of the optoelectronic component are located at the bottom of cavity 18 and use soldering parts 20.

In order to achieve this known assembly, the measurements of the following parts must be controlled:

depths of the cavity, height of the bumps, thickness of the metallized areas needed for the electric connections, and distance of optical stripe 19 of optoelectronic component 2 from surface 15 of said component 2. JP06088917 A (NEC CORP) discloses a method for connecting an optical waveguide and an end of an optical fiber. This method consists of forming solder balls on metal pads which are provided on a support. Metal pads provided on the optical waveguide and on the side surface of the end of the optical fiber are connected in such a way that a portion of these pads contact the solder balls.

IEEE TRANSACTIONS ON COMPONENTS, HYBRIDS, AND MANUFACTURING TECHNOLOGY, VOL. 15, N° 6, DECEMBER 1992, pages 977 to 981 discloses the manufacturing of arrays of electroluminescent diodes by bonding these diodes by means of solder balls on a substrate.

GB 2 215 912 A (PLESSEY CO PLC) discloses a method for checking the positionning of solder connections between a substrate and an optical component.

IEEE CIRCUITS AND DEVICES MAGAZINE, vol. 8, n° 6, November 1992, pages 25 to 31 discloses the optical alignment of an optical component and an optical fiber on a substrate. The fiber is bonded on a shaped groove belonging to the susbtrate. The component is bonded to the latter and aligned by means of solder balls.

U.S. Pat. No. 5,024,372 A (ALTMAN LEONARD F ET AL) discloses the forming of cylindrical solder elements on a substrate by photolithography.

SUMMARY OF THE INVENTION

The aim of the present invention is to define a structure that enables a highly accurate passive alignment of optical components to be achieved that that uses neither a block nor a cavity.

To achieve this aim, the inventors have developed a structure based on assembling optical components from an interconnection substrate and based on the technique of interconnection electronic components using micro-pellets.

These micro-pellets are produced from a meltable metal such as indium or a tin/lead based meltable alloy.

Given that the micro-pellets are located on the interconnection substrate, the components can be assembled in a single operation.

Optical alignment of the components parallel to the plane of the substrate is effected by the surface tension forces of the solder micro-pellets, a technique described in documents (2) and (3).

In an upwards direction, i.e. perpendicular to this plane, the optical alignment is controlled by the volumes relative to the micro-pellets.

Due to this structure, the alignment accuracy of the components is highly successful as the alignment accuracy is no longer absolute but relative.

The numerous advantages of the invention are as follows:

1) It is unnecessary for the components to be accurately aligned parallel to the plane of the substrate.

The components are self-aligned due to the use of micro-pellet technology.

Errors relating to self-alignment are less than 1 $\mu$m.

When the meltable metal that constitutes the micro-pellets hardens, the surface tension forces of the metal when melted and the wettability of said metal on the metal fastening studs enable the components to be self-aligned on the substrate that receives them.

The axis of each fastening stud located on the substrate is identical to the axis of the corresponding stud located on the component to be positioned.

The accuracy with which the components are aligned in relation to each other, in a plane that is parallel to the substrate, is solely dependent on the accuracy with which the micro-pellet fastening studs on the optical components are aligned with the optical axes.

These studs are preferably aligned using photolithography such that a resulting error may easily be reduced to less than 0.3 $\mu$m with equipment used in microelectronics.

Concerning the substrate, the studs that receive the micro-pellets of all the optical components are preferably formed simultaneously such that any relative error between studs is almost non-existent if thermal dilation is ignored.

In other words, these studs are self-aligning.

2) Vertical alignment accuracy, i.e. alignment that is perpendicular to the plane of the substrate, of the various components in relation to each other is extremely successful as the accuracy is relative between each component and the interconnection substrate whereas in FIG. 1, the accuracy of positioning between optoelectronic component 2 and waveguides 6 and 8 is inevitably absolute.

This observation is of utmost importance as the present invention eliminates the need to perfectly control the volume of micro-pellets in order to vertically align the components in relation to each other.

Because the micro-pellets are located on the interconnection substrate, the micro-pellet volumes are calculated such that after hybridization the distances between the optical axes of the components are identical in relation to the surface of the interconnection substrate.

These micro-pellets are generally produced from cylindrical discs the volumes of which are calculated to be equal respectively to the preferred volumes of the micro-pellets.

If melting is to be performed under flux, the volume of the discs must be slightly greater than that of the micro-pellets.

These volumes are controlled by controlling diameters D and the thicknesses E of the discs.

When parameter D results from photolithography, the error caused by the parameter D is of no significance.

The thickness E of the deposited material is thus the parameter to be controlled.

The relative error $\Delta V/V$ of volume V of a micro-pellet is therefore equal to the relative error $\Delta E/E$ of thickness E.

On the other hand, a positive or negative fluctuation of thickness E in relation to the nominal value causes a fluctuation of the same kind in all the hybrid components relative to the interconnection substrate.

The relative movement is very small and therefore ensures correct alignment of the components in relation to each other.

3) As the micro-pellets are simultaneously produced on the interconnection substrate and as the thickness of the meltable material that is deposited is more or less uniform, the respective volumes required for the micro-pellets are achieved using discs of suitable diameters.

4) Electrical connections between optoelectronic or electronic components and interconnection studs can be effected on a substrate plane and not in cavities as shown in FIG. 1.

5) All the alignment blocks machined in or on each optical component are eliminated.

More precisely, the present invention mainly relates to an assembly of a plurality of optical components on a support according to claim 1.

Therefore, the size of the second stud may be varied in order to obtain the preferred bump volume.

Optical alignment of the components along a direction within a plane that is parallel to the surface of the support is automatically achieved by the tension forces of the melted bumps.

"Optical component" refers to a purely optical component as well as an optoelectronic component.

In one particular embodiment of assembly to which the present invention relates, at least one of the optical components is an optoelectronic component and the support also comprises electric lines that are electrically connected to the optoelectronic component using corresponding bumps.

In this event, said bumps and the corresponding studs must be electric conductors.

These lines can be integrated in the support or positioned on the surface of said support.

The present invention also relates to a process for obtaining an assembly of a plurality of optical components on a support according to claim 5.

The optical alignment of the components along a direction within a plane that is parallel to the surface of the support is automatically achieved due to the tension forces of the melted parts.

According to a preferred implementation of the process of the invention, the parts formed on the second studs are more or less cylindrically shaped and are all of the same thickness.

According to a particular implementation of the process of the invention, the elements provided on the second studs are brought to the melted state, each part then becoming more or less pellet shaped, these pellet shaped parts are then brought to the hardened state before being brought to the melted state in order for the components to be assembled onto the support.

The shape of the pellet depends on the shape of the stud and is not, therefore, necessarily spherical.

Advantageously, in order to obtain the same accuracy concerning the height of the various pellets the parts, that are more or less cylindrically shaped, are formed simultaneously on the second studs using photolithography.

The material of the parts can be chosen, for example, from the group that comprises indium and tin-lead alloys.

According to one particular implementation of the invention at least one of the components is optoelectronic, the studs and corresponding parts being electric conductors, and the support is also provided with electric lines that are intended to be electrically connected to the optoelectronic component using corresponding parts.

BRIEF DESCRIPTION OF THE DRAWINGS

Greater understanding of the present invention will be attained from the description of the examples given below. The examples, that are non-limitative, refer to the attached drawings in which:

FIG. 1, previously described, is a schematic view of a known optical component assembly, FIG. 2 is a schematic view of an optical component assembly according to the present invention.

DETAILED DESCRIPTION OF THE PREFERRED EMBODIMENTS

Figure 3A:
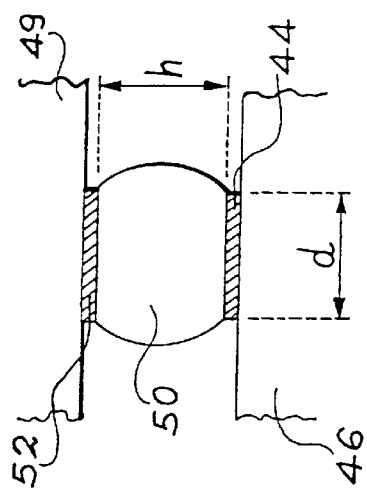
FIGS. 3A, 3B and 3C show schematically a cylindrical solder part that, by being melted, becomes a micro-pellet (FIG. 3B), said micro-pellet being used to connect an optical component (FIG. 3C).

In order to simplify the description, the examples are given for a plane of a substrate, the invention clearly having applications to substrates with a non-plane surface also, the volumes of the bumps being determined such that the topology of the substrates is taken into account.

FIG. 2 shows schematically an assembly according to the invention that comprises two optical components on an interconnection substrate or support 21 the surface S of which is plane.

One of these components has the reference number 22 and comprises a waveguide 26 the optical axis of which is axis X.

The other component has the reference number 24 and also comprises a waveguide 28 the optical axis of which is axis X1.

Axes X and X1 are parallel to surface S of substrate 21.

Another axis Y may be considered that is also parallel to surface S and that, moreover, is perpendicular to axis X such that plane XY is parallel to surface S.

Axis Z may also be considered that is perpendicular to surface S.

A vertical optical alignment of components 22 and 24 should be obtained, i.e. an alignment along direction Z.

In other words, axis X1 should be contained in plane XY.

Furthermore, a horizontal optical alignment of components 22 and 24 should be obtained, i.e. an alignment along a direction that is contained in a plane parallel to surface S of substrate 21.

In other words, axis X1 should be the same as axis X.

Component 22 is fastened to plane surface S of substrate 21 using soldering parts or micro-pellets 30.

This surface S is provided with fastening studs 32.

Component 22 is provided with other fastening studs 34 that correspond to studs 32 respectively and each micro-pellet 30 is fastened to stud 32 on one side and to stud 34 on the other.

Similarly, component 24 is fastened to plane surface S of substrate 21 using soldering parts or micro-pellets 36.

This surface S is provided with fastening studs 38.

Component 24 is provided with other fastening studs 40 that correspond to studs 38 respectively and each micro-pellet 36 is fastened to stud 38 on one side and to stud 40 on the other, as seen in FIG. 2.

The distance Δ1 is known from axis X to the surface of component 22 that is located opposite plane surface S of substrate 21.

The distance Δ2 from axis X1 to the surface of component 24 that is located opposite said plane surface S is also known.

Under these conditions the volumes V1 of micro-pellets 30 and the volumes V2 of micro-pellets 36 are calculated such that distance Z1 from axis X to the plane surface S is equal to distance Z2 from axis X1 to this plane surface.

Concerning the obtaining of micro-pellets 30 and 36 a slight negative (respectively positive) variation (error) of V1 leads to a negative (respectively positive) variation (error) of V2 and therefore to a simultaneous reduction (respectively an increase) of Z1 and Z2, thus minimizing the relative error between Z1 and Z2.

The micro-pellets automatically ensure the alignment of components 22 and 24 in relation to each other but they can also ensure the electrical interconnection of one of these components when the component is optoelectronic.

FIG. 3A shows schematically a soldering disc 42 of diameter D and thickness E that is provided on a disc shaped metal interconnection stud 44 of diameter d, said stud being, itself, formed on the plane surface of an interconnection substrate 46.

Disc 42 is intended to provide a micro-pellet that is used to fasten an optical component to substrate 46.

The volume of disc 42 is referred to as V.

Diameter d of stud 44 is adapted to this volume V that is also the volume of the micro-pellet formed on disc 42 as the volume is maintained when the micro-pellet is produced.

Figure 3B:
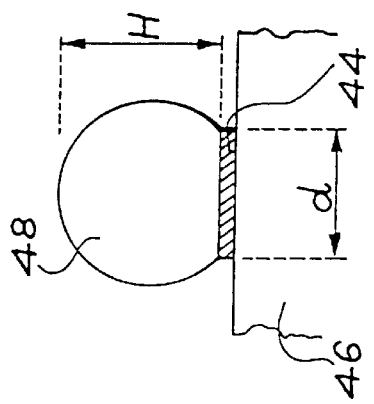

FIG. 3B shows this micro-pellet, referred to as 48, that is formed on the fastening stud 44 when disc 42 is heated above the temperature at which it melts.

Micro-pellet 48 (of volume V) is more or less spherical and truncated on one side, with a height referred to as H.

Figure 3C:
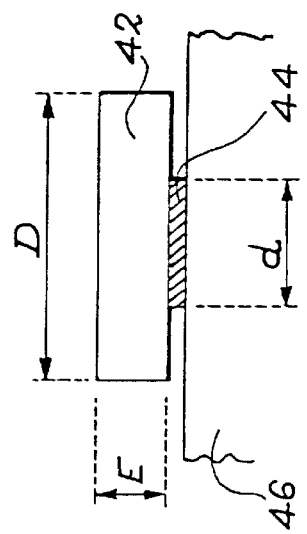

FIG. 3C shows schematically the connection between an optical component 49, that is provided with a fastening stud 52, and the surface of substrate 46 using a micro-pellet, referred to as 50, that connects studs 44 and 52.

This micro-pellet 50 (of volume V) is more or less spherical and truncated on both sides, with a height referred to as h.

Micro-pellet 50 results from the micro-pellet 48 in FIG. 3B re-melting.

Soldering disc 42 is preferably formed using an electrodeposit technique through a photosensitive resin.

In this event, volume V is equal to the product of the surface opening in the resin multiplied by the height of the soldering metal deposited in this opening.

Preferably, in the present invention, the micro-pellets located on the interconnection substrate are produced from a uniform thickness of the meltable material deposit using said electrodeposit technique through a photosensitive resin.

The respective volumes of micro-pellets are then adjusted from the openings in the resin.

Any errors concerning an opening (with diameter D) are generally very small due to the use of lithography.

Moreover, an error concerning diameter d of the fastening stud 44 is also very small if masking and controlled etching are used to produce such a stud.

An error concerning volume V is therefore in proportion to the error concerning thickness E of the meltable material that has been deposited.

Therefore, this error has the same direction fluctuation as that of the deposited thickness E and for all the micro-pellets, whatever their respective volumes.

Error ΔV/V concerning volume V is equal to error ΔE/E concerning this thickness E.

The present inventors have verified, using calculations and experiments, that the fact of changing from a disc (FIG. 3A) to a spherical cap (FIG. 3B and FIG. 3C) reduces the relative error ΔH/H concerning height H and the relative error Δh/h concerning height h relative to thickness E.

In other words, relative error ΔH/H is less than ΔE/E.

Similarly, Δh/h is less than ΔE/E.

This is used to advantage in reducing the incertitude concerning the height of optical components after hybridization and therefore in further reducing the relative positioning error between these optical components.

FIG. 4 again shows the optical alignment of optical components 22 and 24 FIG. 2 on substrate 21 of.

Figure 4:
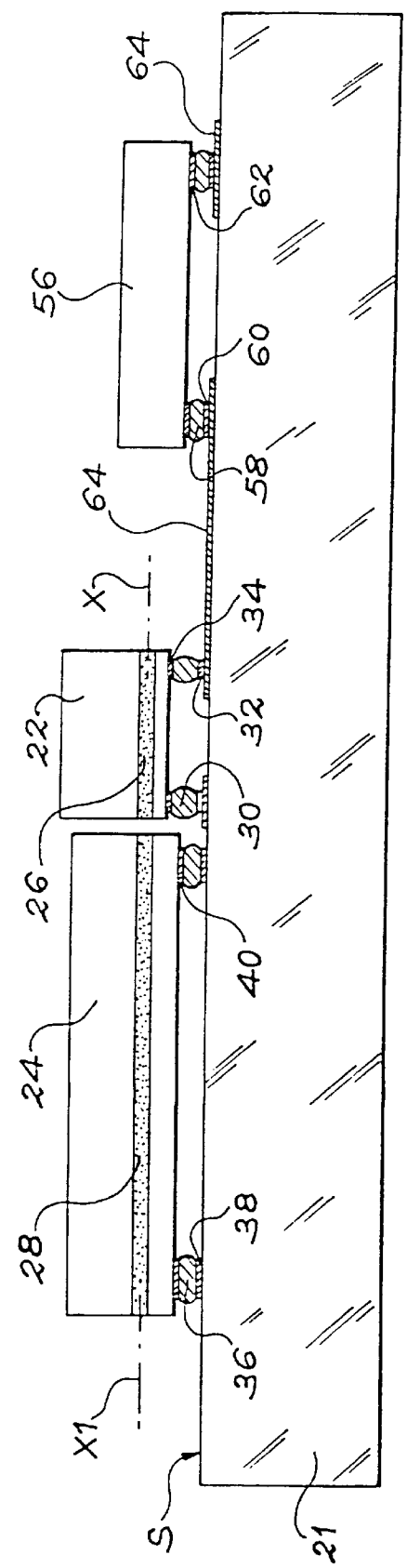
FIG. 4 shows schematically another assembly according to the invention.

In the example of FIG. 4 component 22 is a laser diode and component 24 is a divisor.

An electronic control circuit 56 has also been fitted to plane surface S of substrate 21 using soldering micro-pellets 58.

Each micro-pellet is fastened on one side to a fastening stud 60 that is located on plane surface S and on the other side to another fastening stud 62 located on the surface of circuit 56 that is opposite said plane surface S.

This electronic circuit 56 can be assembled using standard interconnection techniques for electronic components.

Only the purely optical component 24 and the optoelectronic component 22 require accurate optical alignment.

FIG. 4 also shows various interconnection tracks 64 intended for the electric interconnections of components that require such interconnections and that use micro-pellets, said micro-pellets being conductor.

FIGS. 5A, 5B, 5C, 5D and 5E show schematically various stages of an optical component assembly process according to the invention.

The aim here is to optically align two optical components 22 and 24 in FIG. 2 on plane surface S of support 21.

As seen above, component 22 is fastened to the plane surface of substrate 21 using soldering micro-pellets 30.

Each micro-pellet 30 is fastened on one side to a fastening stud 32 formed on the plane surface of substrate 21 and on the other side to another fastening stud 34 with which the surface of component 22, opposite this surface of substrate 21, is provided.

Similarly, each soldering micro-pellet 36 of component 24 is fastened on one side to a fastening stud 38 formed on the plane surface of substrate 21 and on the other side to another fastening stud 40 formed on the surface of component 24 that is located opposite said plane surface of substrate 21.

Each stud 32, 34, 38 and 40 is clearly wettable by the material that constitutes micro-pellets 30 and 36 whereas this does not apply to the area surrounding these studs.

Figure 5A:
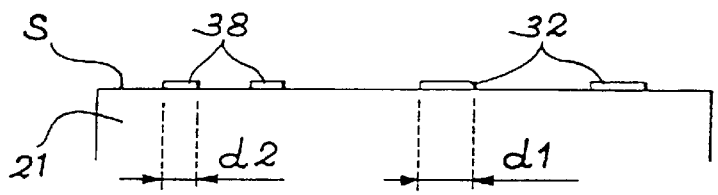
FIGS. 5A thru 5E show schematically various stages of a process according to the invention.

In FIG. 5A, fastening studs 32 and 38 of the various micro-pellets that are to be produced subsequently are formed on plane surface S of substrate 21.

In order for this to be achieved, a metal deposit may be sprayed on the entire surface of the component using TiNiAu-type cathode sputtering techniques followed by a photolithography stage and an etching stage.

These fastening studs may be any shape, for example, circular, hexagonal, octagonal or square and even rectangular.

Therefore, the micro-pellets are not necessarily spherical.

In the example shown, these studs are discs of diameter d1 for studs 32 and discs of diameter d2 for studs 38.

The measurements of these studs (diameters d1 and d2 in the example shown) are determined from the preferred heights of the micro-pellets when counting parallel to the surface of substrate 21.

Moreover, electric interconnection lines can be projected that are integrated in substrate 21 or located on the surface of said substrate, using subsequently formed micro-pellets, in order to provide an electric power supply to the components that require one.

Advantageously, in the event of interconnection lines (not shown) being provided on the surface of substrate 21, a defined surface of the material used for these electric interconnections can be provided under the fastening studs that are not electrically connected in order to maintain all the fastening studs of the micro-pellets at the same height.

Figure 5B:
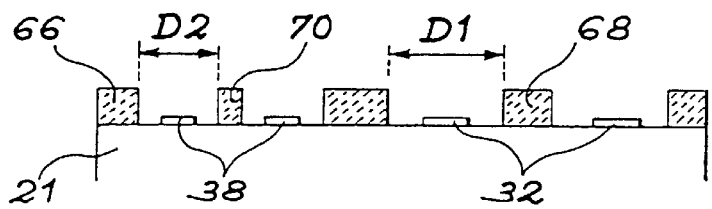

FIG. 5B then shows a lithograph stage in which the volumes of the micro-pellets are defined from diameters D1 and D2 and from thickness E and that are chosen for the discs made of meltable material.

A layer of photosensitive resin 66 is deposited on the plane surface of substrate 21 and the resin is insolated to define circular openings 68 of diameter D1, said diameter being that of component 22, and other circular openings 70 of diameter D2 being that of component 24.

Figure 5C:
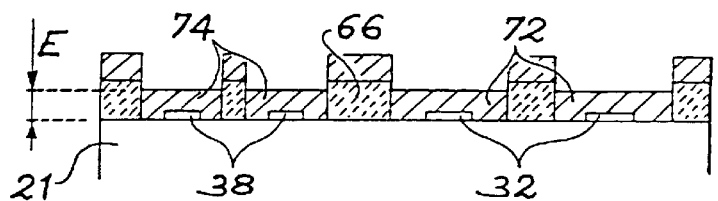

In FIG. 5C the meltable material intended to form the subsequent micro-pellets is then deposited using evaporation across openings 68 and 70 that have been previously provided. The material is deposited until a thickness E of meltable material is obtained in the openings and on the layer of resin.

As shown in FIG. 5C, soldering discs 72 with D1 diameter and soldering discs 74 with D2 diameter are provided respectively above studs 32 and 38.

Diameters D1 and D2 of the openings to be made in the layer of resin 66 can be deduced because the following measurements are known: thickness E common to all discs 72 and 74, respective diameters d1 and d2 of studs 32 and 38 and respective heights h1 and h2 of micro-pellets 30 and 36 to be formed.

Once soldering discs 72 and 74 are formed, the layer of resin 66 is eliminated using "lift off".

The meltable material deposited on said layer is therefore eliminated.

Figure 5D:
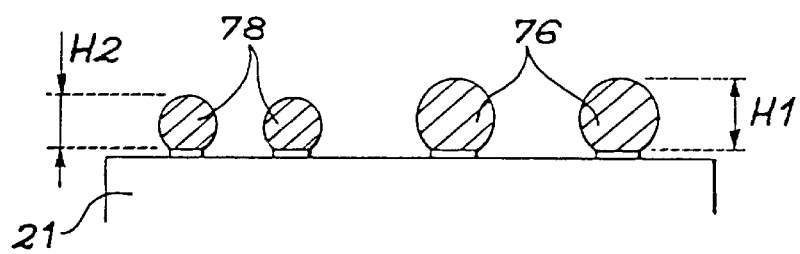

In FIG. 5D the temperature of substrate 21 is raised above the melting temperature of the material that constitutes discs 72 and 74 and micro-pellets 76 are therefore obtained that correspond to component 22 and micro-pellets are obtained that correspond to component 24, these micro-pellets being fastened to studs 32 and 38 respectively.

FIG. 5D shows height H1 of micro-pellets 76 and height H2 of micro-pellets 78.

Figure 5E:
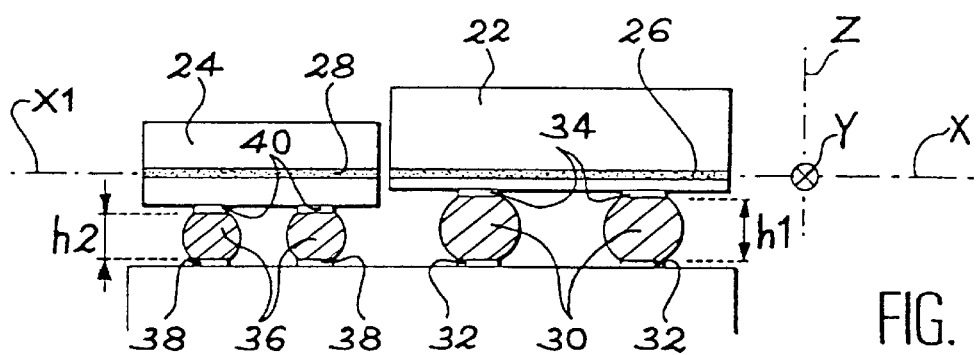

FIG. 5E shows the hybridization of optical components 22 and 24.

In order for this to be achieved, components 22 and 24 are suitably positioned respectively on micro-pellets 30 and 36 such that the fastening studs 34 and 40 of these components lie respectively on the corresponding micro-pellets.

The temperature of the micro-pellets is then raised above their melting temperature.

The optical alignment of components 22 and 24, that are aligned along optical axes X and X1, is thus implemented automatically.

In plane XY that is parallel to plane surface S of substrate 21 the alignment is a result of surface tension forces of the meltable material.

This alignment is obtained along axis Z using the adapted volumes of the micro-pellets that enable the differences of distance to be compensated between the optical axes of the components and the surfaces of said components on which the fastening studs of the micro-pellets are provided.

The melting stage shown in FIG. 5D is not always required.

The hybridization of components 22 and 24 can be effected using discs 72 and 74 on which said components 22 and 24 are suitably positioned.

The temperature of the discs is then raised above the temperature at which the discs melt.

The drawing in FIG. 5E is then attained.

The solder is then left to cool to ambient temperature which results in hybridization of the components on the substrate.

What is claimed is:

1. An optical apparatus, comprising:
    a support comprising support fastening studs;
    optical components each having an optical axis and each comprising component fastening studs; and
    bumps comprising a meltable material, each of said bumps being provided between one of said support fastening studs and one of said component fastening studs, wherein:
        said bumps have a height so that the optical axes of the optical components are aligned with each other along a direction perpendicular to a surface of said support, the height of each of said bumps being dependent on the size of a support fastening stud fastened to said each of said bumps,
        said support fastening studs and said component fastening studs are wettable by said meltable material,
        said support comprises areas surrounding said support fastening studs and not wettable by said meltable material, and
        said optical components comprise areas surrounding said component fastening studs and not wettable by said meltable material.

2. The apparatus of claim 1, wherein:
    at least one of the optical components is an optoelectronic component,
    the support further comprises electric lines electrically connected to the optoelectronic component by corresponding bumps, and
    said corresponding bumps and corresponding support fastening studs and component fastening studs being electrically conductive.

3. The apparatus of claim 2, wherein the electric lines are integrated into the support.

4. The apparatus of claim 2, wherein the electric lines are provided on the surface of the support.

5. A process for assembling optical components on a support, each of said optical components having an optical axis, comprising:

forming component fastening studs on each of said optical components;

forming support fastening studs on a surface of the support;

forming parts with a meltable material on said support fastening studs and having a height depending on the size of said support fastening studs;

positioning said optical component so that said component fastening studs are positioned on said parts; and melting said meltable material, thereby fastening said optical components to said support so that the optical axes of the optical components are aligned with each other along a direction that is perpendicular to the surface of the support.

6. The process of claim 5, wherein forming said parts comprises forming parts having a substantially cylindrical shape and a same thickness.

7. The process of claim 5, wherein forming said parts comprises:

melting said meltable material into more or less pellet shape parts;

hardening said more or less pellet shape parts; and melting said more or less pellet shape parts to said support fastening studs.

8. The process of claim 6, wherein forming said parts comprises forming parts having a substantially cylindrical shape by photolithography.

9. The process of claim 5, wherein forming said parts comprises forming parts with a material selected from the group consisting of indium and a tin-lead alloy.

10. The process of claim 5, wherein:

at least one of the components is an optoelectronic component, support fastening studs, component fastening studs and parts corresponding to said optoelectronic component are electrically conductive, and further comprising forming electric lines on the support, said electric lines being electrically connected to the optoelectronic component by the corresponding parts.

* * * * *